(12) United States Patent
Wallis et al.

(10) Patent No.: US 8,803,117 B2
(45) Date of Patent: Aug. 12, 2014

(54) APPARATUS AND METHOD FOR NON-LATCHING, BI-DIRECTIONAL COMMUNICATION OVER AN ELECTRICALLY ISOLATED DATA LINK

(75) Inventors: David W. Wallis, Decatur, GA (US); James R. West, Lawrenceville, GA (US)

(73) Assignee: Motorola Solutions, Inc., Schaumburg, IL (US)

( * ) Notice: Subject to any disclaimer, the term of this patent is extended or adjusted under 35 U.S.C. 154(b) by 314 days.

(21) Appl. No.: 13/434,635

(22) Filed: Mar. 29, 2012

(65) Prior Publication Data

US 2013/0256569 A1 Oct. 3, 2013

(51) Int. Cl.
*G02B 27/00* (2006.01)

(52) U.S. Cl.
USPC .......................................................... 250/551

(58) Field of Classification Search
CPC .............. H03K 7/56; H03K 19/01759; H03K 19/01843; H03K 19/14
USPC ........................................................ 250/551
See application file for complete search history.

(56) References Cited

U.S. PATENT DOCUMENTS

| | | |
|---|---|---|
| 5,790,526 A | 8/1998 | Kniess et al. |
| 5,848,252 A | 12/1998 | Granau et al. |
| 6,014,040 A | 1/2000 | Tracy |
| 6,018,804 A | 1/2000 | George |
| 6,822,480 B1 | 11/2004 | McCalmont |
| 7,348,803 B2 | 3/2008 | Bui et al. |
| 7,359,640 B2 * | 4/2008 | Onde et al. .................... 398/135 |
| 7,840,734 B2 | 11/2010 | Murfett et al. |
| 2005/0100046 A1 | 5/2005 | Chou et al. |
| 2005/0122154 A1 | 6/2005 | Lee et al. |

OTHER PUBLICATIONS

International Search Report and Written Opinion for International Patent Application No. PCT/US2013/028876, mailed Jul. 16, 2013.
Home—Opto isolated 1-Wire bus—Extracted from http://home.kpn.nl/thomas_7/1 Wire/1 wire_isolating.html 5 pages—Jun. 2007.
Hendon Semiconductors—TR002: Techniques for buffering I2C signals—2008—2 Pages.

* cited by examiner

*Primary Examiner* — Thanh Luu
(74) *Attorney, Agent, or Firm* — Barbara R. Doutre

(57) ABSTRACT

An isolation apparatus and method are provided for bi-directional communication over a single wire link without circuit latch up. The isolation is provided by two identical but independent switching circuits designed to eliminate latch up while controlling two optical isolators in a bi-directional mode of operation.

20 Claims, 3 Drawing Sheets

APPARATUS AND METHOD FOR NON-LATCHING, BI-DIRECTIONAL COMMUNICATION OVER AN ELECTRICALLY ISOLATED DATA LINK

FIELD OF THE INVENTION

The present invention relates generally to bi-directional data circuits and more particularly to the isolation of bi-directional data circuits within a charger.

BACKGROUND

Electrical isolation of bi-directional data streams is particularly desirable in communication systems utilizing single wire links. However, bi-directional isolation circuits used in the past have faced problems with latching. A latching condition may occur when, for example, under conditions in which a receive logic path goes low and transfers this input low to its output, the output in turn is detected as being low, and this low signal is returned to the input, resulting in the original input being pulled/latched low. This undesirable latched condition remains even when the external low drive signal is removed.

Chargers, such as those used for charging the batteries of portable radios, often utilize bi-directional circuits for electrical isolation of data streams and can therefore encounter the latching issues discussed above. In a multi-unit charger for example, noise coupling from one charger pocket to another may lead to a latched condition. Likewise, when a computer is coupled to a multi-unit charger, such as for data retrieval or programming, ground loops may lead to a latched condition. The latched condition at the charger can lead to improper charging and/or false status indications to the user.

Accordingly, there is a need for an improved bi-directional circuit. Such a circuit would be beneficial to various electronic devices, such as battery chargers.

BRIEF DESCRIPTION OF THE FIGURES

The accompanying figures where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
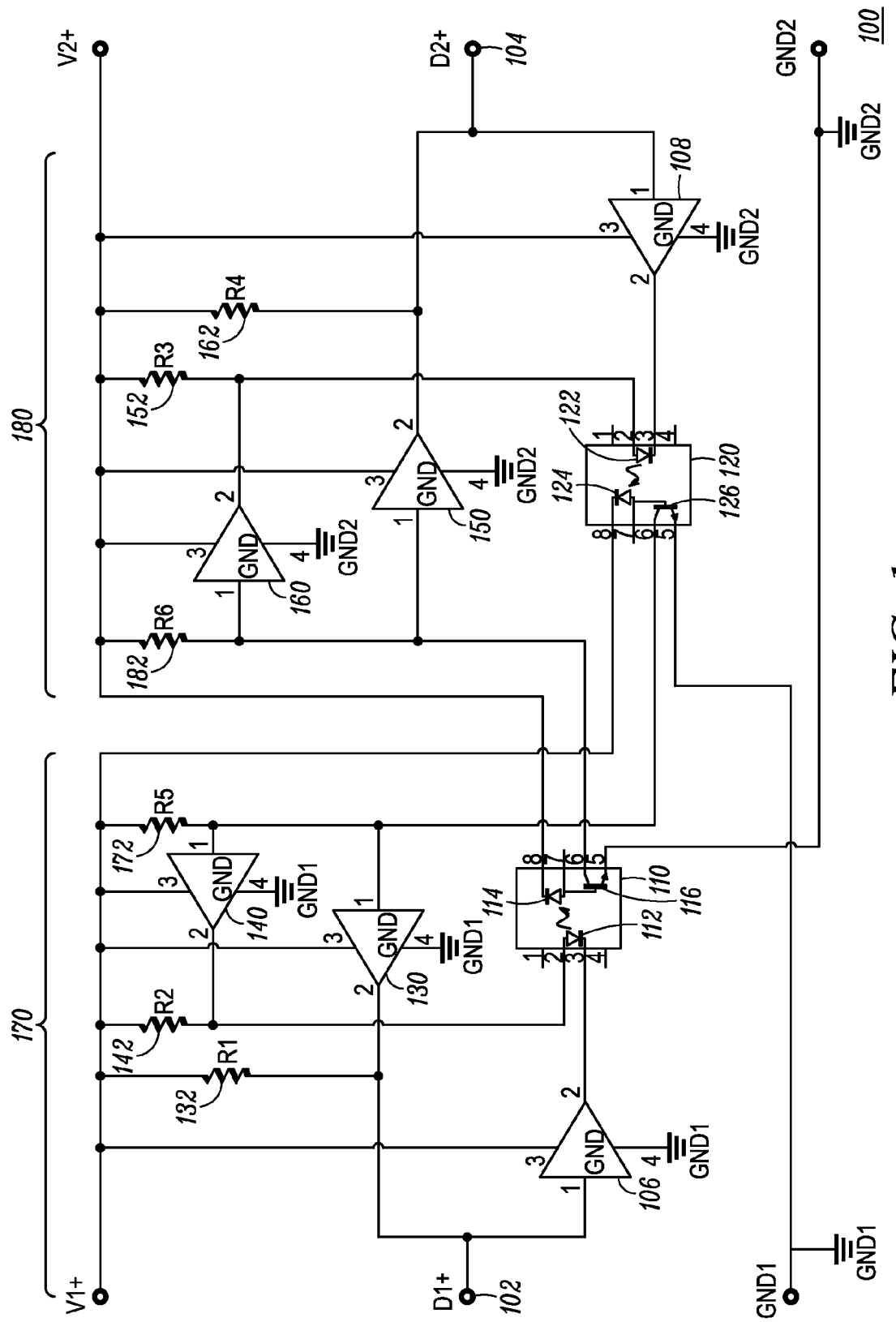
FIG. 1 is a schematic diagram of an isolation circuit in accordance with the various embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in apparatus components and method steps in which for isolating bi-directional communication over a single wire link. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

Briefly, there is provided herein a bi-directional communication system for effective electrical isolation of bi-directional data streams. A circuit is provided which isolates bi-directional communication over a single wire link without circuit latch-up. The isolation is provided by two identical but independent switching circuits designed to eliminate latch-up while controlling two optical isolators in a bi-directional mode of operation. The various embodiments are extremely advantageous to electronic circuits for any product that employs a two way data bus or communications circuit, such as battery charger designs.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

It will be appreciated that embodiments of the invention described herein may be comprised of one or more conventional processors and unique stored program instructions that control the one or more processors to implement, in conjunction with location sensing circuits and certain non-processor circuits, some, most, or all of the functions of a location sensing system and method of storing and sharing location information described herein. The non-processor circuits may include, but are not limited to, a radio receiver, a radio transmitter, signal drivers, clock circuits, power source circuits, and user input devices. As such, these functions may be interpreted as steps of a method to perform sharing of device location details. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

FIG. 1 is a schematic diagram of a circuit 100, operating in accordance with the various embodiments. Circuit 100 provides an isolated data link for bi-directional data lines (D1) 102 and (D2) 104 within independent circuits 170, 180 operated by separate supplies and grounds, V1, GND1 and V2, GND2. Data lines D1 102 and D2 104 operate as a single wire data link. As data line D1 102 operates as an input, data line D2 104 operates as an output. As data line D2 104 operates as an input, data line D1 102 operates as an output. In this embodiment, circuit 100 comprises first and second optocouplers 110 and 120. Each optocoupler 110, 120 respectively comprises a light emitting diode 112, 122, (LEDs) optically coupled with an integrated photo detector switch consists of a photo diode 114, 124 and a high speed transistor 116, 126, integrated on-chip respectively. The emitter of transistor 116 of optocoupler 110 is coupled to GND2. The emitter of transistor 126 of optocoupler 120 is coupled to GND1. In accordance with the embodiments to be described herein, circuit 100 eliminates latch up conditions which, in past circuits, have caused both LEDs 112, 122 to be turned on at the same time due to ground loops and noise coupling. In alternative embodiment configurations, the optocouplers 110, 120 may be replaced for example by suitable optical, RF devices, such as laser diodes and receivers, pin diodes and other transmitters and receivers.

In accordance with the embodiments, circuit 100 comprises four open drain devices (or alternatively open collector devices) 130, 140, 150, 160. The open drain, collector devices 130, 140 of circuit 170 are coupled through pull-up resistors (R1) 132, (R2) 142 to supply V1 respectively. The open drain, collector devices 150, 160 of circuit 180 are coupled through pull-up resistors (R3) 152, (R4) 162 to supply V2 respectively. The remaining description will simply refer to the devices 130, 140, 150, 160 as open drain devices or buffers.

For open drain devices 130, 140, 150, 160, may be implemented, for example, using high speed CMOS buffers, such as those provided by 74HC07 integrated circuits or the like. For open collector devices, the devices 130, 140, 150, 160, may be implemented, for example, using 74LS07 integrated circuits or the like. It is possible to also use discrete transistors to implement this logic function.

The pull-up resistor (R2) 142 of circuit 170 provides current limiting for driving the LED1 112 of optocoupler 110. The pull-up resistor (R3) 152 of circuit 180 provides current limiting for driving the LED2 122 of optocoupler 120. A pull-up resistor (R5) 172 is coupled to the collector of transistor 126 of optocoupler 120. A pull-up resistor (R6) 182 is coupled the collector of transistor 116 optocoupler 110.

Data lines D1 102 and D2 104 are coupled to buffers 106, 108 respectively. Buffers 106, 108 are high speed buffers for switching the LEDs 112, 122 on and off. Buffers 106, 108 are totem pole output type buffers (not open drain) and contain internal resistance sufficient to drive a predetermined current through the LEDs. For example, 74HC08 CMOS buffers can be used to drive approximately 25 mA of current through the LEDs. It is possible to also use discrete transistors to implement this logic function.

In accordance with the embodiments, circuit 100, allows signals to be transmitted (D1 or D2) between the two electrically separated circuits 170, 180 up to predetermined frequencies. For example, applications for digital data in a high speed CMOS bus can operate over a 2 to 6 volt range and 50 megahertz or higher frequency ranges over a single wire link. Detailed operation of circuit 100 is provided next D1: High to Low As data line D1 102 operates as an input, data line D2 operates as an output. A low input to D1 places a low at the input of buffer 106, which generates a low at the output of buffer 106. A low at the output of buffer 106 pulls the cathode of LED1 112 low. The pull-up resistor R2 142 at the anode of LED1 thus turns the LED1 on. The LED1 112 being turned on causes the transistor 116 of optocoupler 110 to turn on. Turning on transistor 116, pulls the collector of transistor 116 low. The collector of transistor 116 is coupled to the open drain inputs of buffers 150, 160, and as the collector of transistor 116 goes low, the inputs to buffers 150, 160 go low. These low inputs to buffers 150, 160 cause the outputs of buffers 150, 160 to go low. The output of buffer 150 is tied to both to D2 104 and the input of buffer 108. As the output of buffer 150 goes low, both D2 and the input to buffer 108 go low. A low at the input of buffer 108 causes a low at the output of buffer 108 which in turn pulls the cathode of LED2 122 of optocoupler 120 low. In accordance with the various embodiments, the output of buffer 160 is coupled to the anode of LED2 of optocoupler 122. As the output of buffer 160 goes low, the anode 122 of optocoupler 120 is pulled low. This results in a low at the anode and cathode of LED2 which maintains LED2 off. Thus, LED1 is ON and LED2 is OFF.

D1: From Low to High

When data line D1 102 operating as an input goes from low to high, the high input to D1 102 places a high at the input of buffer 106, which generates a high at the output of buffer 106. The high at the output of buffer 106 pulls the cathode of LED1 112 high. The pull-up resistor R2 142 places a high at the anode of LED1 112. A high at both the anode and cathode of LED1 112 keeps the LED1 in an off state. With LED1 being off, the transistor 116 of optocoupler 110 is turned off. Turning off transistor 116 of optocoupler 110 allows the collector output to go high through the pull-up resistor (R6) 182. The collector output of transistor 116 going high places a high at the input of buffer 150 which thereby generates a high output. The high output of buffer 150 pulls D2 104, operating as an output, high and presents a high to buffer 108. A high at buffer 108 generates a high at the output of buffer 108 which pulls the LED2 122 cathode high. In accordance with the various embodiments, the collector output of transistor 116 going high places a high at the input of buffer 160 which thereby generates a high output. The LED2 122 anode is thus also pulled high by the high output of buffer 160. The high at the anode and cathode of LED2 122 of optocoupler 120 maintains LED2 off. Thus LED2 is OFF and LED1 is OFF.

D2: From High to Low

As D2 104 operates as an input, D1 operates an output. A low at D2 causes the output of buffer 108 to go low. A low at the output of buffer 108 pulls the cathode of LED2 122 low. The anode of LED2 122 is pulled high by the pull-up resistor R3 152 which limits the current and turns LED2 122 ON. With the LED2 turned ON, the transistor 126 also turns ON thereby pulling its collector low. The collector output of transistor 126 of optocoupler 120 is tied to the inputs of buffers 130, 140 and with the collector pulled low these buffer inputs are also pulled low. The low at the input of buffer 130 generates a low at the output of buffer 130, thereby pulling D1 102 low. D1 102 is coupled to the input of buffer 106. A low at the input of buffer 106 generates a low at the output of buffer 106. A low at the output of buffer 106 pulls cathode of LED1 112 low. In accordance with the various embodiments, the low at the input to buffer 140 generates a low at the output of buffer 140. The output of buffer 140 is tied to the anode of LED1 112 of optocoupler 110. The anode of the LED1 112 is pulled low by the low output of buffer 140. LED1 112 of optocoupler 110 is turned off by having a low at its anode and cathode. Hence, LED1 is OFF and LED2 is ON.

D2: From Low to High

When data line D2 104, operating as an input, goes from a low to high, the high input to D2 104 places a high at the input of buffer 108, causing the output of buffer 108 to go high. The high on the output of buffer 108 pulls the cathode of LED2 122 of optocoupler 120 high. The anode of LED2 122 is pulled high via pull-up resistor (R3) 152. The anode and cathode of LED2 being pulled high keeps the LED2 off. The turning off of LED2 122 causes the transistor 126 of optocoupler 120 to be turned off. Turning off the transistor 126 pulls its collector high, via pull-up resistor (R5) 172. The high at the collector of transistor 126 places a high at the inputs to buffers 130 and 140. The high at the input of buffer 130 generates a high at the output of buffer 130. The high at the output of buffer 130 pulls both D1 102 and the input to buffer 106 high. The input of buffer 106 being high causes the output of buffer 106 to go high which in turn pulls the cathode of LED1 112 high. In accordance with the various embodiments, the high at the input of buffer 140 generates a high at the output of buffer 140. The anode of LED1 112 is thus pulled high via the high output of buffer 140. Thus, LED1 112 is turned off by having its anode and cathode pulled high. Hence, LED1 is OFF and LED2 is OFF.

Splitting Data Lines for Bi-Directional Operation.

To summarize, by splitting data lines D1 102 and D2 104 for bi-directional operation, each data line can be coupled to open drain devices (or open collector devices). By utilizing open drain or open collector devices latch up is prevented by operating one of the open drain or open collector devices to switch the cathode of a first optocoupler LED from logic high to low while simultaneously switching the other open drain or open collector device to switch the anode of the same optocoupler LED from logic High to Low. Repeating the configuration to control a second optocoupler LED enables bi-directional operation.

Figure 2:
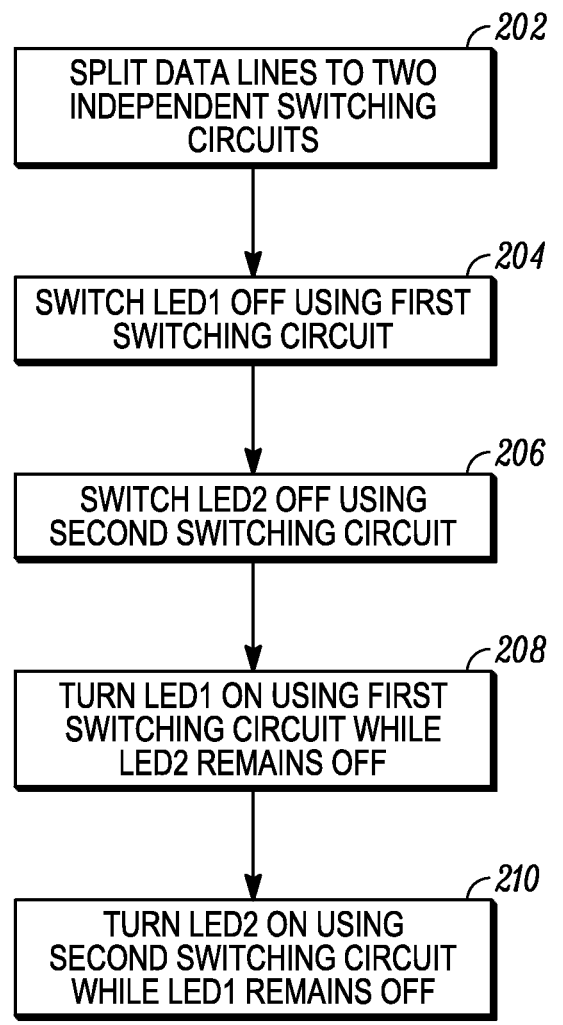
FIG. 2 is a flowchart of a method for isolating bi-directional data lines in accordance with the various embodiments.

FIG. 2 is a flowchart 200 of a method for isolating bi-directional data lines over a single wire data link. At 202 first and second bi-directional data lines are split between two identical but independent first and second switching circuits respectively. The first and second switching circuits each operate from independent supply input and GND as was seen in FIG. 1.

At 204, a first LED is controlled with the first switching circuit in response to the first switching circuit being controlled by the second data line. The first switching circuit simultaneously switches the anode and the cathode of the first LED. At 206, the second LED is controlled with the second switching circuit, the second switching circuit being controlled by the first data line. The second switching circuit simultaneously switches the anode and the cathode of the second LED. The first LED is turned on at 208 with the first switching circuit, while the second LED is maintained off with the second switching circuit. The second LED is turned on at 210 with the second switching circuit, while the first LED is maintained off with the first switching circuit.

Figure 3:
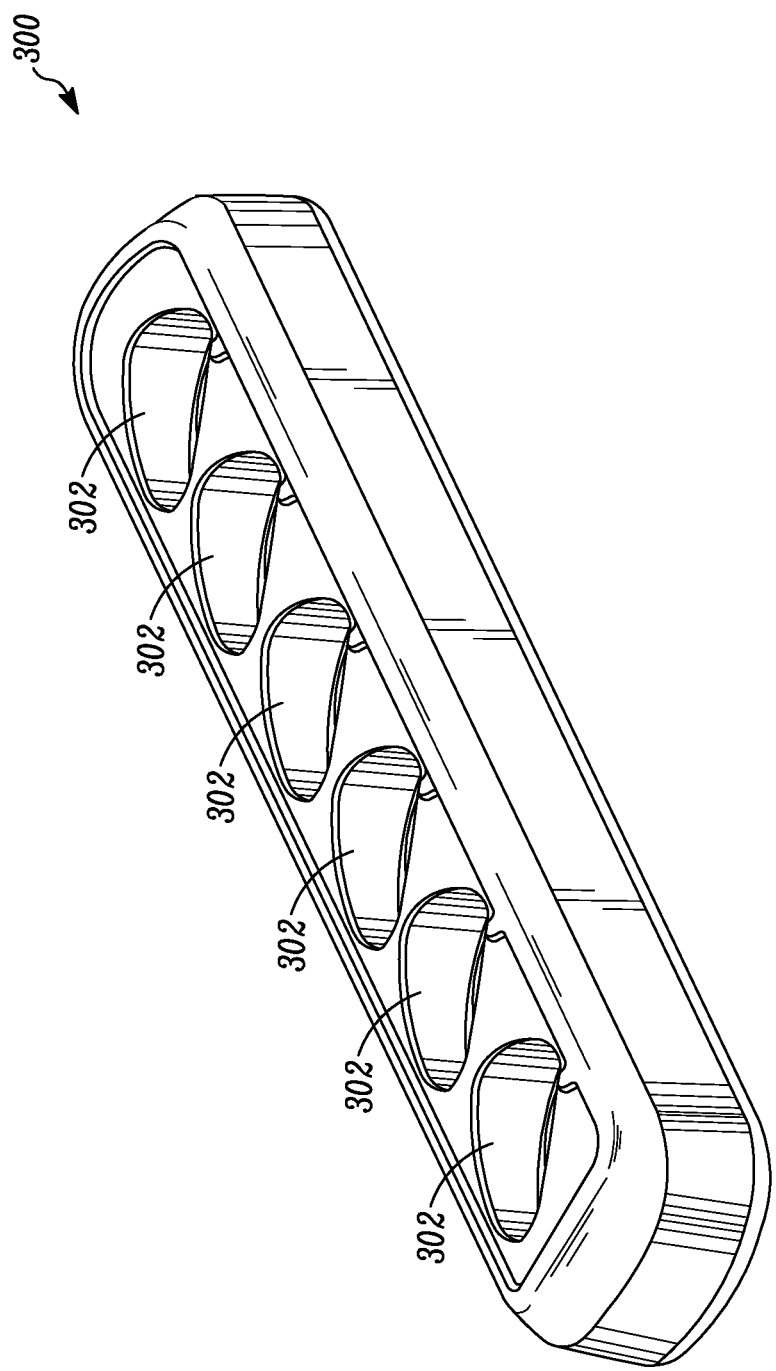
FIG. 3 is a charger operating in accordance with the various embodiments.

FIG. 3 is charger 300 formed and operating in accordance with the various embodiments. Charger 300 includes a plurality of charger pockets for receiving battery packs and/or battery operated portable radios. There is one circuit per pocket that would be connected to a microprocessor either through separate inputs or one individual input and software is used to identify which pocket is transmitting or receiving data.

Accordingly, an improved isolation circuit for bi-directional data lines. The isolation circuit operating in accordance with the various embodiments, separates the ground such that ground loops and noise coupling are eliminated. When implemented in a multi-pocket charger, this independent circuit operation prevents coupling from one pocket to another, thereby eliminating false indications to the user. When the charger is coupled to a computer, the ability to read data and program the charger without the disturbances caused by ground loops is advantageous.

Unlike circuits which utilize non-symmetric, tri-level logic which still face issues with isolation due to noise and power supply range limitations, the apparatus and method for non-latching, bi-directional communication over an electrically isolated data link provided by the various embodiments eliminates all of these problems.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

We claim:

1. An isolation circuit, comprising:
first and second split data lines for bi-directional operation, wherein both the split data lines are coupled to open drain or open collector devices for preventing latch up by operating one of the open drain or open collector devices to switch a cathode of an optocoupler LED from a logic high to a logic low while simultaneously operating the other open drain or open collector device to switch an anode of the optocoupler LED from a logic high to a logic low, thereby maintaining the optocoupler LED off.

2. The isolation circuit of claim 1, wherein the open drain or open collector devices switch a cathode of another optocoupler LED from a logic low to a logic high while simultaneously operating the other open drain or open collector device to switch an anode of the another optocoupler LED from a logic low to a logic high, thereby maintaining the another LED off.

3. The isolation circuit of claim 1, wherein the isolation circuit operates within a communication device that employs a two way data bus.

4. The isolation circuit of claim 1, wherein the communication device comprises a charger for charging battery packs or battery powered portable radios.

5. An isolation circuit for a communication device, comprising:
first and second optical, RF devices;
first, second third, and fourth buffers coupled to the first and second optical, RF devices, the first, second, third and fourth buffers being either open drain or open collector devices, wherein:
the first buffer is coupled to a cathode of the first optical, RF device;
the second buffer is coupled to an anode of the first optical, RF device;
the third buffer is coupled to a cathode of the second optical, RF device;
the fourth buffer is coupled to an anode of the second optical, RF device; and
the first and second buffers maintain the first optical, RF device off by providing logic level low to the anode and cathode of the first optical, RF device during data flow in a first direction; and
the third and fourth buffers maintain the second optical, RF device off by providing logic level high to the anode and cathode of the second optical, RF device during data flow in a second direction.

6. The isolation circuit of claim 5, wherein the anode and cathode of the first optical, RF device and the anode and cathode of the second optical, RF device are provided by at least two: LEDs of two optocouplers, laser diodes with receivers, or pin diodes with receivers.

7. The isolation circuit of claim 5, wherein the communication device comprises a charger.

8. The isolation circuit of claim 5, wherein the isolation circuit isolates bi-directional communication over a single wire link.

9. An isolation circuit, comprising:
first and second optocouplers (110, 120) having first and second LEDs respectively;
first, second third, and fourth buffers (130, 140, 150, 160) coupled to the first and second optocouplers, the first, second, third and fourth buffers being either open drain or open collector devices, wherein:
the first buffer (130) is coupled to the cathode of the first LED
the second buffer (140) is coupled to an anode of the first LED;
the third buffer (150) is coupled to the cathode of the second LED;
the fourth buffer (160) is coupled to the anode of the second LED; and
the first and second buffers maintain the first LED off by providing logic level low to the anode and cathode during data flow in a first direction; and
the third and fourth buffers maintain the second LED off by providing logic level high to the anode and cathode of the second LED during data flow in a second direction.

10. The isolation circuit of claim 9, wherein the isolation circuit operates within a communication device for isolating bi-directional communication over a single wire link.

11. The isolation circuit of claim 10, wherein the communication device comprises a charger.

12. An isolation circuit, comprising:
first and second optocouplers being used as a bi-directional isolator, the first optocoupler having an LED1 under control of a transistor of the second optocoupler, and the second optocoupler having an LED2 under the control of a transistor of the first optocoupler;
first and second data lines (D1, D2) being independently buffered to the LED1 and LED2 respectively;
a first open drain, collector device (130) for switching the data line (D1), operating as an output, from supply to GND while switching the cathode side of the LED1 from supply to GND;
a second open drain, collector device (140) for simultaneously switching the anode of LED1 from supply to GND, thereby maintaining the potential difference across LED1 at 0V dc, thereby preventing LED1 from lighting and latching the other circuit;
a third open drain, collector device (150) for switching the data line (D2), operating as an output, from supply to GND while switching the cathode side of the LED2 from supply to GND; and
a fourth open drain, collector device (160) for simultaneously switching the anode of LED2 from supply to GND, thereby maintaining the potential difference across LED2 at 0V dc, thereby preventing LED2 from lighting and latching the other circuit.

13. The isolations circuit of claim 12, wherein the open drain, collector device comprises either an open drawing device or an open collector device.

14. The isolation circuit of claim 12, wherein the isolation circuit operates within a communication device for isolating bi-directional communication over a single wire link.

15. The isolation circuit of claim 14, wherein the communication device comprises a multi-pocket charger, and the isolation circuit separates the GND thereby eliminating ground loops and noise coupling amongst pockets of the multi-pocket charger.

16. A method for isolating data lines, comprising:
splitting data lines for bi-directional operation, wherein both the split data lines are coupled to open drain or open collector devices for preventing latch up by operating one of the open drain or open collector devices to switch a cathode of an optocoupler LED at the first side of the circuit from logic high to how and simultaneously operating the other open drain or open collector device to switch the anode of the optocoupler LED from logic high to low; and
deploying open drain or open collector devices at in an independently supplied and grounded circuit to enable bi-directional operation.

17. The method of claim 16, wherein the method isolates data lines of a two way data bus of a communication device.

18. A method for isolating bi-directional data lines over a single wire link, comprising:
splitting first and second bi-directional data lines between two identical but independent first and second switching circuits respectively;
controlling a first LED with the first switching circuit, the first switching circuit being controlled by the second data line, the first switching circuit simultaneously switching the anode and the cathode of the first LED;
controlling the second LED with the second switching circuit, the second switching circuit being controlled by the first data line, the second switching circuit simultaneously switching the anode and the cathode of the second LED;
turning the first LED on with the first switching circuit on while maintaining the second LED off with the second switching circuit; and
turning the second LED on with the first switching circuit while maintaining the first LED off with the first switching circuit.

19. The method of claim 18, wherein the first and second switching circuits each operate from independent supply input and ground (gnd).

20. The method of claim 19, wherein the first and second switching circuits operate from independent supply input and ground (gnd) within a communication device.

* * * * *

UNITED STATES PATENT AND TRADEMARK OFFICE
CERTIFICATE OF CORRECTION

| | | |
|---|---|---|
| PATENT NO. | : 8,803,117 B2 | Page 1 of 1 |
| APPLICATION NO. | : 13/434635 | |
| DATED | : August 12, 2014 | |
| INVENTOR(S) | : David W. Wallis et al. | |

It is certified that error appears in the above-identified patent and that said Letters Patent is hereby corrected as shown below:

IN THE SPECIFICATION:

In Column 3, Line 56, delete "next" and insert -- next. --, therefor.

IN THE CLAIMS:

In Column 6, Line 48, in Claim 5, delete "second" and insert -- second, --, therefor.

In Column 7, Line 15, in Claim 9, delete "second" and insert -- second, --, therefor.

In Column 7, Line 20, in Claim 9, delete "LED" and insert -- LED; --, therefor.

In Column 8, Line 6, in Claim 13, delete "isolations" and insert -- isolation --, therefor.

In Column 8, Line 22, in Claim 16, delete "how" and insert -- low --, therefor.

Signed and Sealed this
Seventeenth Day of May, 2016

Michelle K. Lee
*Director of the United States Patent and Trademark Office*